(12) United States Patent
Hirayama et al.

(10) Patent No.: US 9,715,991 B2
(45) Date of Patent: Jul. 25, 2017

(54) CHARGED PARTICLE BEAM DEVICE AND SPHERICAL ABERRATION CORRECTION METHOD

(71) Applicant: Hitachi High-Technologies Corporation, Minato-ku, Tokyo (JP)

(72) Inventors: Yoichi Hirayama, Tokyo (JP); Hirokazu Tamaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/125,989

(22) PCT Filed: Apr. 4, 2014

(86) PCT No.: PCT/JP2014/059944
§ 371 (c)(1),
(2) Date: Sep. 14, 2016

(87) PCT Pub. No.: WO2015/151271
PCT Pub. Date: Oct. 8, 2015

(65) Prior Publication Data
US 2017/0117115 A1    Apr. 27, 2017

(51) Int. Cl.
*H01J 37/153* (2006.01)
*H01J 37/14* (2006.01)
*H01J 37/26* (2006.01)

(52) U.S. Cl.
CPC .......... *H01J 37/153* (2013.01); *H01J 37/14* (2013.01); *H01J 37/26* (2013.01); *H01J 2237/1534* (2013.01); *H01J 2237/2802* (2013.01)

(58) Field of Classification Search
CPC ........ H01J 37/14; H01J 37/143; H01J 37/153; H01J 37/26; H01J 37/28; H01J 37/29;
(Continued)

(56) References Cited

U.S. PATENT DOCUMENTS

| 5,134,288 A | 7/1992 | Van Dijck |
| 6,605,810 B1 | 8/2003 | Haider et al. |

(Continued)

FOREIGN PATENT DOCUMENTS

| CN | 102053358 A | 5/2011 |
| CN | 102064074 A | 5/2011 |

(Continued)

OTHER PUBLICATIONS

International Search Report (PCT/ISA/210) issued in PCT Application No. PCT/JP2014/059944 dated Jun. 10, 2014 with English-language translation (three (3) pages).

(Continued)

*Primary Examiner* — David E Smith
(74) *Attorney, Agent, or Firm* — Crowell & Moring LLP

(57) ABSTRACT

In general, in a multipole lens of an aberration corrector of a charged particle beam device, there is only one condition that can be set where both a spherical aberration correction condition and magnetic saturation are satisfied. Therefore, a plurality of acceleration voltages cannot be handled. Consequently, the present invention provides a spherical aberration corrector that satisfies the magnetic saturation state for a plurality of aberration correction conditions by selectively magnetizing a plurality of pole groups of the multipole lens according to the changes in the objective lens magnetization current.

12 Claims, 3 Drawing Sheets

(58) Field of Classification Search
CPC .......... H01J 37/2955; H01J 2237/1534; H01J 2237/2802
See application file for complete search history.

(56) References Cited

U.S. PATENT DOCUMENTS

| | | | |
|---|---|---|---|
| 2003/0098415 A1 | 5/2003 | Matsuya et al. | |
| 2007/0114403 A1* | 5/2007 | Hosokawa | H01J 37/153 250/310 |
| 2007/0158567 A1 | 7/2007 | Nakamura et al. | |
| 2007/0181806 A1* | 8/2007 | Nakano | H01J 37/153 250/310 |
| 2009/0039281 A1* | 2/2009 | Kawasaki | G01N 23/20 250/396 R |
| 2011/0102572 A1 | 5/2011 | Kihara et al. | |
| 2011/0114852 A1 | 5/2011 | Henstra | |
| 2012/0119107 A1* | 5/2012 | Sawada | H01J 37/1471 250/396 ML |
| 2013/0320227 A1* | 12/2013 | Urano | H01J 37/153 250/396 R |
| 2014/0231666 A1 | 8/2014 | Akima et al. | |
| 2015/0136980 A1* | 5/2015 | Iijima | H01J 37/21 250/311 |

FOREIGN PATENT DOCUMENTS

| | | |
|---|---|---|
| JP | 4-233150 A | 8/1992 |
| JP | 2002-510431 A | 4/2002 |
| JP | 2004-199912 A | 7/2004 |
| JP | 2007-207634 A | 8/2007 |
| WO | WO 2013/015102 A1 | 1/2013 |

OTHER PUBLICATIONS

Japanese-language Written Opinion (PCT/ISA/237) issued in PCT Application No. PCT/JP2014/059944 dated Jun. 10, 2014 (four (4) pages).
Chinese-language Office Action issued in counterpart Chinese Application No. 201480077095.5 dated Apr. 14, 2017 (6 pages).

* cited by examiner

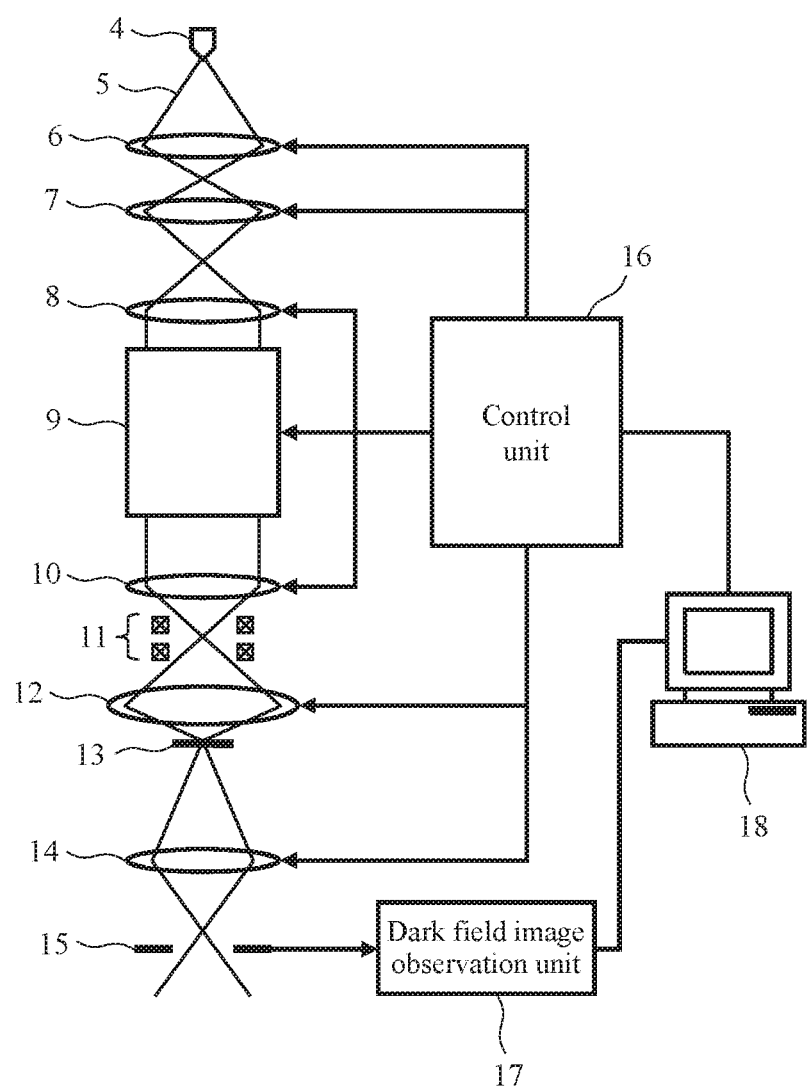

CHARGED PARTICLE BEAM DEVICE AND SPHERICAL ABERRATION CORRECTION METHOD

TECHNICAL FIELD

The present invention relates to a charged particle beam device including a spherical aberration correction device, and to a spherical aberration correction method.

BACKGROUND ART

In recent years, a charged particle beam device such as a transmission electron microscope (TEM) or a scanning transmission electron microscope (STEM) may include a spherical aberration correction device (hereinafter, also referred to as an "aberration corrector"). The aberration corrector is used to correct a spherical aberration (Cs) of an objective lens, which is a main factor that limits the resolving power of a TEM or a STEM. An aberration corrector is known which includes two multipole lenses generating hexapole fields, and two rotationally symmetric lenses (transmitting lenses) that are disposed therebetween (for example, refer to PTL 1).

The aberration corrector corrects a positive Cs of an objective lens by generating a negative Cs. However, an extra aberration, which is called a parasitic aberration, occurs due to imperfectness of the aberration corrector, that is, the positional offset of an individual pole of a multipole lens, a variation in magnetic characteristics of a pole material, or the like. Third-order or lower occurring parasitic aberrations are a two-fold symmetry first-order astigmatism (A1), a one-fold symmetry second-order coma aberration (B2), a three-fold symmetry second-order astigmatism (A2), a two-fold symmetry third-order star aberration (S3), and a four-fold symmetry third-order astigmatism (A3). In addition to the correction of the spherical aberration Cs, the correction of these parasitic aberrations is essential for adjusting the aberration corrector.

CITATION LIST

Patent Literature

JP A 2002-510431

SUMMARY OF INVENTION

Technical Problem

Typically, the spherical aberration Cs is corrected by adjusting the magnetization current of the multipole lens, and thus changing the hexapole field. The magnetization current of the multipole lens required to correct the spherical aberration (Cs) is determined by the focal length of the objective lens and the spherical aberration Cs. If the magnetization current of the objective lens is constant, the focal length of the objective lens and the spherical aberration Cs are constant, and thus, the magnetization current of the multipole lens also becomes constant.

The imperfectness of the multipole lens has a component that deflects electron beams. For example, if current magnetizing the multipole lens is slightly changed, a deflecting component is applied to electron beams, and thus, the electron beams are moved. As a result, seemingly, the focal point of the electron beams does not converge on one point, and a resolving power decreases. The deflecting component generated by the imperfectness of the multipole lens is dependent on a relationship between current and magnetic field.

Typically, if current flows through a magnetic material of a coil, a magnetic field increases proportional to the current. Since the magnetic material is magnetically saturated from a given current value, even if current higher than the current value flows through the magnetic material, the magnetic field is saturated, and does not increase. In a state where the magnetic material is magnetically saturated as such, the amount of change in magnetic field with respect to current decreases. That is, in a state where the multipole lens is magnetically saturated, a deflecting component occurring due to a slight change in magnetization current is smaller than that in a state where the multipole lens is not magnetically saturated. As a result, in order to prevent the occurrence of a decrease in resolving power caused by the deflecting component of the multipole lens, the multipole lens is desirably used in a state where poles are magnetically saturated.

In contrast, if the magnetization current of the objective lens is considerably changed, for example, if an acceleration voltage is changed in the same device, the focal length of the objective lens and the spherical aberration Cs are considerably changed. It is necessary to considerably change the hexapole field of the multipole lens so as to correct the spherical aberration Cs; however, since the poles are magnetically saturated, even if the magnetization current of the multipole lens is increased, the generated hexapole field does not increase. If the magnetization current of the multipole lens is decreased, it may be possible to obtain a desired hexapole field. In contrast, since the multipole lens is not in a magnetically saturated state, a resolving power decreases due to an effect (the magnitude of a deflecting component is sensitively changed by even a slight change in magnetization current, and thus, electron beams are considerably moved) of a deflecting component generated by the imperfectness of the multipole lens. That is, in the related art, the aberration corrector is capable of satisfying a magnetically saturated state in only one condition for the magnetization current of the multipole lens required to correct the spherical aberration (Cs).

The present invention provides an aberration corrector having multiple conditions for the magnetization current of a multipole lens required to correct a spherical aberration (Cs) in a magnetically saturated state such that even if the magnetization current of an objective lens is considerably changed, it is possible to correct an aberration, which is a difficult task in the related art.

Solution to Problem

In order to achieve this object, the present invention provides a spherical aberration corrector that satisfies a magnetically saturated state in multiple aberration correction conditions by selectively magnetizing multiple sets of pole groups of a multipole lens according to a change in the magnetization current of an objective lens.

Advantageous Effects of Invention

According to the present invention, it is possible to provide a spherical aberration corrector having multiple Cs correction conditions in a state where poles are magnetically saturated, and even if the magnetization current of an objective lens is considerably changed, it is possible to correct a Cs. Tasks, configurations, and effects other than the aforementioned become apparent from the following description of an embodiment.

BRIEF DESCRIPTION OF DRAWINGS

FIG. 5 is a diagram illustrating an example of the configuration of a charged particle beam device of the example.

DESCRIPTION OF EMBODIMENTS

Example 1

Figure 1:
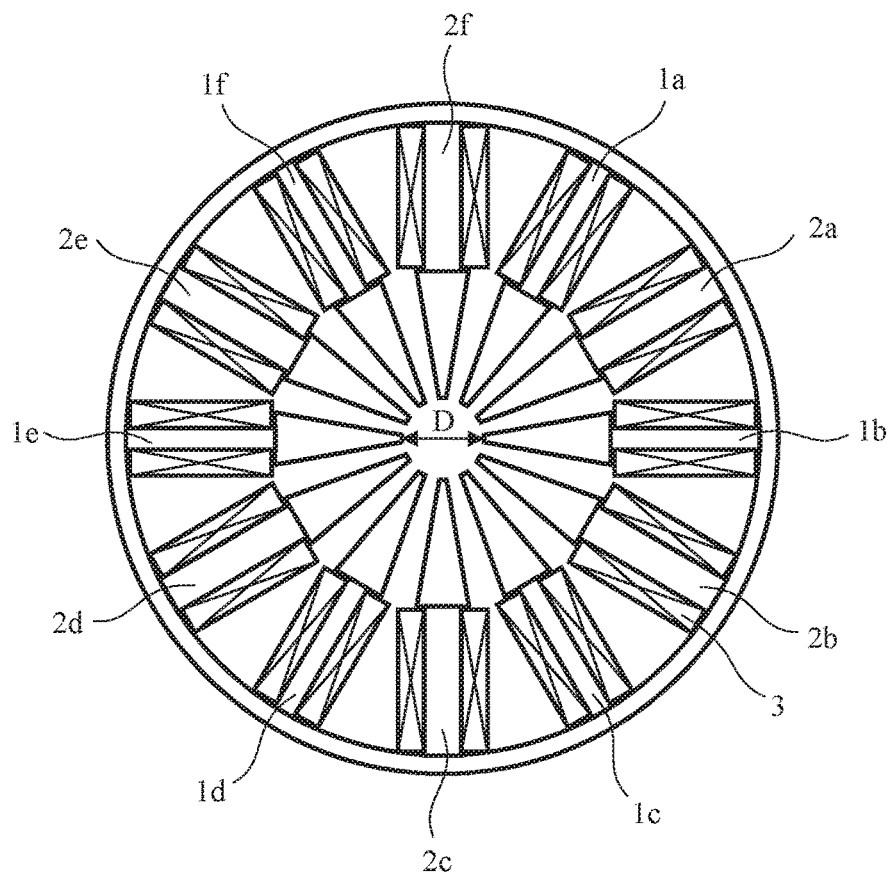
FIG. 1 is a view illustrating an example of the configuration of a multipole lens (12-pole lens) used in Example 1.

Hereinafter, an example of the present invention will be described in detail with reference to the accompanying drawings. The example to be described hereinafter is merely an example in which the present invention is realized, and does not limit the technical scope of the present invention. In the drawings, the same reference signs are assigned to the common configuration elements. In the example, a STEM is exemplified as a charged particle beam device; the present invention is not limited to the STEM, and for example, can be applied to a TEM.

FIG. 1 is a schematic view of a multipole lens used in the example. FIG. 1 illustrates the configuration of a 12-pole lens including 12 poles. The present invention can be applied to a multipole lens including 12 or more poles (the number of poles is given by a multiple of six).

For the sake of convenience, the following description will be given in a state where the 12 poles are broken down into (1) a pole group 1 including six poles 1a to 1f which are point symmetrically disposed with respect to an optical axis, and (2) a pole group 2 including other six poles 2a to 2f which are point symmetrically disposed in the same manner. In the case illustrated in FIG. 1, the poles 2a to 2f of the pole group 2 are respectively disposed between the poles 1a to 1f of the pole group 1.

The six poles 1a to 1f of the pole group 1 have the same shape, and the six poles 2a to 2f of the pole group 2 also have the same shape. The shape of the poles 1a to if of the pole group 1 may be the same as or different from that of the poles 2a to 2f of the pole group 2.

In order to correct a spherical aberration Cs, a hexapole field is generated by magnetizing six or 12 poles via coils 3. A hexapole field is generated by magnetizing the poles 1a, 1c, and 1e to the same polarity (for example, plus), and magnetizing the poles 1b, 1d, and 1f to a reverse polarity (for example, minus). Similarly, a hexapole field is generated by magnetizing the poles 2a, 2c, and 2e to the same polarity, and magnetizing the poles 2b, 2d, and 2f to a reverse polarity. A hexapole field can be generated by combining the two hexapole fields together. Accordingly, there are three types of methods of generating a hexapole field in the multipole lens illustrated in FIG. 1. It is possible to provide an optimal hexapole field using three types of acceleration voltages. In addition, it is possible to provide two types of hexapole fields by magnetizing only one of a first pole group and a second pole group, or magnetizing the first pole group and a pole group including all the 12 poles (the first pole group+the second pole group).

The strength of a hexapole field which corrects the spherical aberration Cs is adjusted by changing the magnetization of the coils 3 illustrated in FIG. 1. The magnetization of the coils 3 is substantially proportional to the strength of the hexapole field. Due to magnetic saturation of the poles, the strength of the hexapole field becomes saturated at a given magnetization or higher. The magnetization of the coils 3, the strength of the hexapole field, and a magnetization value indicating magnetic saturation can be controlled by a pole material, a pole shape, or the like.

Figure 2:
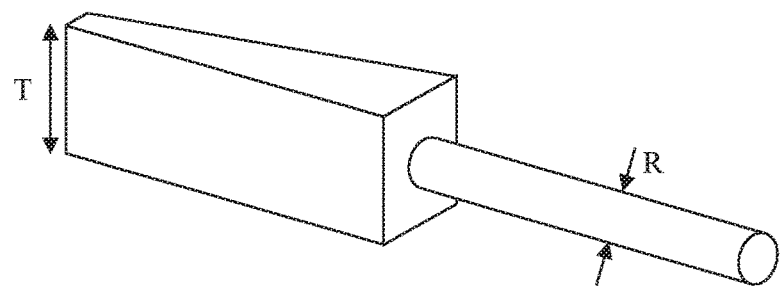
FIG. 2 is a view illustrating the shape of an individual pole of the 12-pole lens.

FIG. 2 illustrates an example of the shape of the pole used inside the 12-pole lens. It is possible to control the strength of the hexapole field or a magnetization indicating magnetic saturation by changing a pole thickness T and the size of a diameter R of a shaft accommodating a coil. It is also possible to control the strength of the hexapole field by changing a pole tip diameter D illustrated in FIG. 1.

Figure 3:
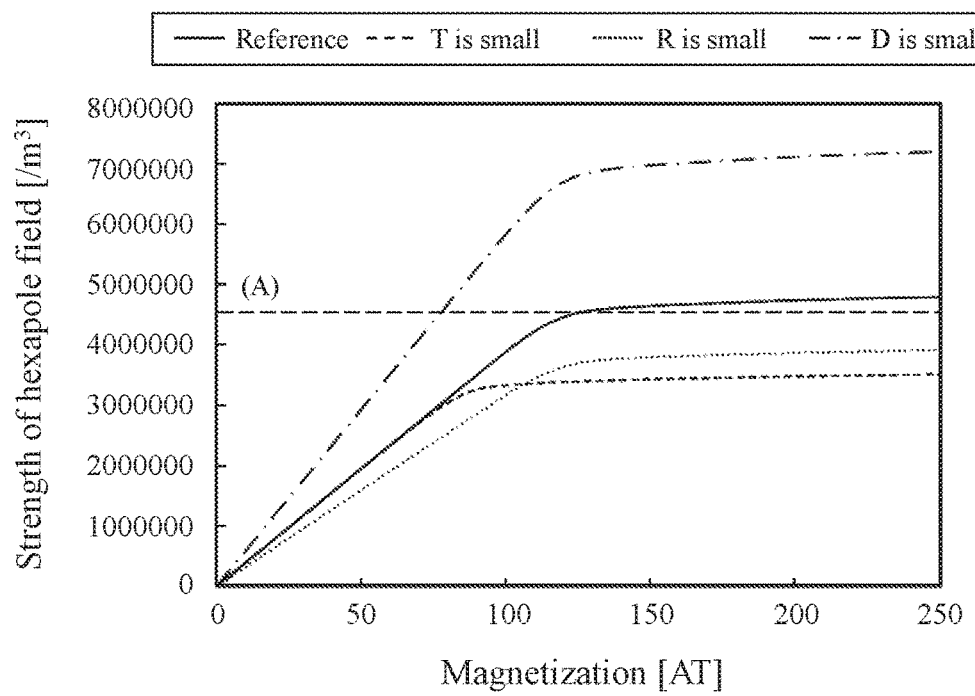
FIG. 3 is a graph illustrating a relationship between the shape of the pole of the 12-pole lens and hexapole field strength.

FIG. 3 illustrates results of the calculation of a relationship between the magnetization of the 12-pole lens and the strength of the hexapole field in a case where the pole shape is changed. A solid line in FIG. 3 illustrates a case in which the pole has a reference shape. A broken line illustrates a case in which the pole thickness T is decreased. A dotted line illustrates a case in which the diameter R of the shaft accommodating the coil 3. A long chain line illustrates a case in which the pole tip diameter D is decreased. As illustrated in FIG. 2, even if the pole shape is changed, the strength of the hexapole field increases substantially proportional to the magnitude of a magnetization, and the hexapole field become saturated at the boundary of a given magnetization value.

If the pole thickness T is decreased (the broken line), the inclination of the strength of the hexapole field with respect to magnetization decreases, and a magnetization indicating a start of saturation is substantially the same. If the diameter R of the shaft accommodating the coil 3 is decreased (the dotted line), the inclination of the strength of the hexapole field with respect to magnetization is not changed, and a magnetization indicating a start of saturation decreases. If the pole tip diameter D is decreased (the long chain line), the inclination of the strength of the hexapole field with respect to magnetization increases, and a magnetization indicating a start of saturation is substantially the same. As such, it is possible to control the strength of the hexapole field by changing the pole shape.

The strength of the hexapole field required to correct the spherical aberration Cs is determined by the focal length of an objective lens and the spherical aberration Cs. The focal length of the objective lens and the spherical aberration Cs are determined by magnetization current of the objective lens. Typically, since a TEM or a STEM is used with the magnetization current of the objective lens substantially constant, the strength of the hexapole field required to correct the spherical aberration (Cs) also is substantially constant. For example, if the strength of the hexapole field required to correct the spherical aberration (Cs) is (A) illustrated in FIG. 3, the condition is satisfied at a magnetically saturated portion of the line illustrating the reference shape, and the condition is satisfied at a linear portion of the line illustrating a shape in which the pole tip diameter D is small.

As described above, if a condition for the strength of the hexapole field required to correct the spherical aberration (Cs) is satisfied at the linear portion of the line, the strength of the hexapole field considerably changes with respect to a slight change in current flowing through the coils 3. Since a magnetic field deflecting electron beams due to an imperfect shape of the multipole lens is superimposed on the hexapole field, a deflecting component also changes sensitively, and moves the electron beams. Therefore, the hexapole field sensitive to current decreases a resolving power. As a result, the spherical aberration (Cs) is desirably corrected in a condition in which the strength of the magnetically saturated hexapole field insensitively changes with respect to current.

If the magnetization current of the objective lens is considerably changed, the focal length of the objective lens and the spherical aberration Cs are considerably changed, and thus, the strength of the hexapole field required to correct the spherical aberration (Cs) also changes considerably. For example, if an acceleration voltage E is changed, the magnetization current of the objective lens is expressed by Expression (1).

$$I_1 = I_0 \times \sqrt{\frac{E_1^*}{E_0^*}} \quad (1)$$

$E_0^*$ represents an original acceleration voltage to which a relativistic correction is added. $E_1^*$ represents another acceleration voltage to which a relativistic correction is added. $I_0$ and $I_1$ respectively represent the magnetization currents of the objective lens at acceleration voltages $E_0$ and $E_1$. For example, the magnetization current of the objective lens at an acceleration voltage of 60 kV becomes approximately 0.52 times the magnetization current of the objective lens at an acceleration voltage of 200 kV. If the acceleration voltage is changed, the magnetization current of the objective lens is considerably changed, and thus, the strength of the hexapole field required to correct the spherical aberration (Cs) also changes considerably.

For example, in a case where the pole shape is a reference shape (the solid line), if the strength of the hexapole field required to correct the spherical aberration (Cs) at an acceleration voltage of 200 kV is (A), as illustrated in FIG. 3, the hexapole field generated by the poles having a reference shape satisfies the condition at a magnetically saturated portion. In contrast, since it is not possible to increase the strength of the hexapole field to the strength (A) or higher, if the strength of the hexapole field required to correct the spherical aberration (Cs) at an acceleration voltage of 60 kV is higher than (A), it is not possible to satisfy a spherical aberration (Cs) correction condition in the poles having a reference shape.

In contrast, if the strength of the hexapole field required to correct the spherical aberration (Cs) at an acceleration voltage of 60 kV is lower than (A), the magnitude of the hexapole field generated by the poles having a reference shape satisfies the spherical aberration (Cs) correction condition, and the inclination of the strength of the hexapole field with respect to magnetization is large (linear portion is used). Therefore, a deflecting component generated by the imperfectness of the multipole lens sensitively changes with respect to a slight change in current, moves electron beams, and thus, decreases a resolving power.

Figure 4:
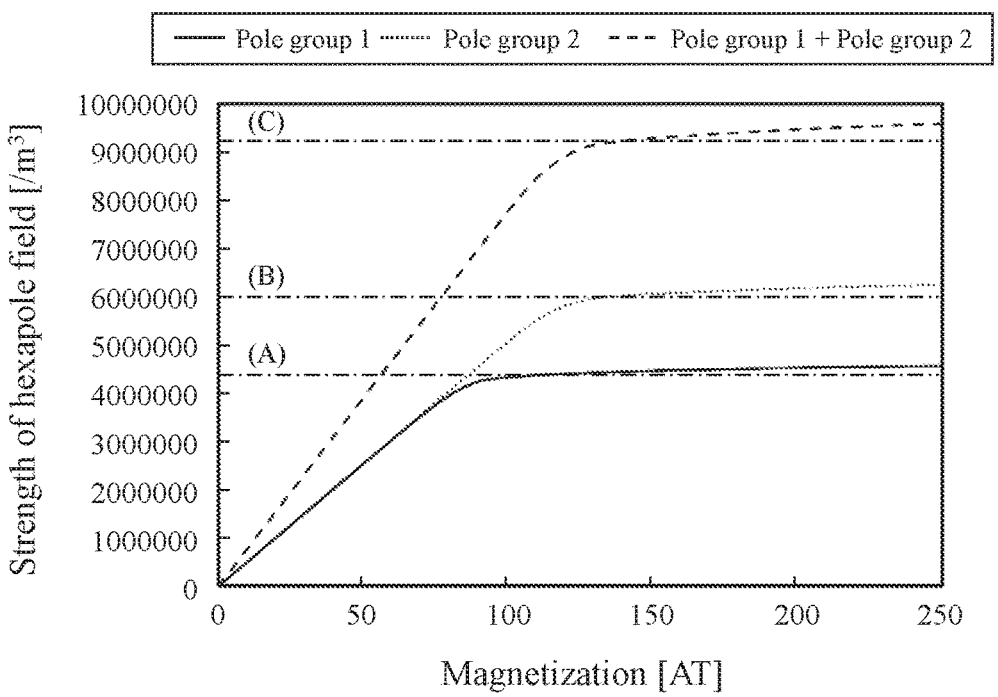
FIG. 4 is a graph illustrating a relationship between the pole group of the 12-pole lens and hexapole field strength.

In the example, the spherical aberration (Cs) at an acceleration voltage of 200 kV is corrected using the pole group 1 (the poles 1a to 1f) illustrated in FIG. 1, the spherical aberration (Cs) at an acceleration voltage of 120 kV is corrected using the pole group 2 (the poles 2a to 2f), and the spherical aberration (Cs) at an acceleration voltage of 60 kV is corrected using both the pole group 1 and the pole group 2. FIG. 4 illustrates results of the calculation of a magnetization and the strength of the hexapole field in a case where the pole group 1 (the poles 1a to 1f), the pole group 2 (the poles 2a to 2f), or both the pole group 1 and the pole group 2 are used.

In the example, the pole group 1 (the poles 1a to 1f) is assumed to have the diameter R of the shaft accommodating the coil 3 which is smaller than that of the pole group 2 (the poles 2a to 2f). (A) to (C) of FIG. 4 are assumed to respectively illustrate the strengths of the hexapole fields required to correct the spherical aberrations Cs at acceleration voltages of 200 kV, 120 kV, and 60 kV. As such, conditions for correcting the spherical aberrations (Cs) at acceleration voltages of 200 kV, 120 kV, and 60 kV can be satisfied at magnetically saturated portions by changing a pole group generating a hexapole field, or combining pole groups together.

As described above, it is possible to arbitrarily control the strength of the obtained hexapole field by changing the pole tip diameter D, the pole thickness T, and the diameter R of the shaft accommodating the coil 3. Accordingly, the 12-pole lens of the example is capable of correcting the spherical aberration Cs in a magnetically saturated state at any one of three acceleration voltages. If the number of poles of the multipole lens is further increased, it is possible to further increase the number of acceleration voltages at which the spherical aberration Cs can be corrected in a magnetically saturated state.

FIG. 5 illustrates an example of the configuration of a charged particle beam device equipped with an aberration corrector that can be magnetized via selection of a pole group or a combination of pole groups as described above. The charged particle beam device illustrated in FIG. 5 is assumed to be a scanning transmission electron microscope (STEM). The scanning transmission electron microscope (STEM) illustrated in FIG. 5 includes an electron beam source 4; irradiation lenses 6 and 7; an adjustment lens 8; an aberration corrector 9; a transfer lens 10; a scan coil 11; an objective lens 12; a projection lens 14; a dark field image detector 15; a control unit 16; a dark field image observation unit 17; and a calculator 18.

In FIG. 5, electron beams 5 released from the electron beam source 4 are expanded or contracted by the irradiation lenses 6 and 7, are focused on an object surface of the adjustment lens 8, and are incident in parallel to the aberration corrector 9 by the lens action of the adjustment lens 8. Each aberration of the electron beams 5 is corrected by the aberration corrector 9, and the electron beams 5 are focused on the upper side of the objective lens 12 by the lens action of the transfer lens 10. The electron beams 5, the aberrations of which have been corrected, are converged by the objective lens 12, and form a very small probe on a specimen 13. The scan coil 11 scans the specimen 13 with the probe, scattered waves coming out from the specimen 13 are detected by the dark field image detector 15, the strength of the scattered waves are synchronized with probe scanning and are displayed as rows of bright spots by the dark field image observation unit 17. As a result, a dark field image of the specimen 13 is obtained. The projection lens 14 adjusts the span of electron beams incident to the dark field image detector 15.

The control unit 16 independently controls the lens actions of the irradiation lenses 6 and 7, the adjustment lens 8, the transfer lens 10, the objective lens 12, and the projection lens 14 via a current source and the like. In addition, the control unit 16 independently controls the magnetization of a multipole lens of the aberration corrector 9. The calculator 18 adjusts the lens action of each lens by transmitting a proper signal to the control unit 16, and calculates (well-known technology) a current value that satisfies an aberration correction condition. The calculator 18 adjusts the aberration corrector 9 by transmitting the calculated current value satisfying the aberration correction condition, and the like, and thus, corrects aberrations. The calculator 18 includes a display unit. An operator can confirm the state of the device by watching the display unit. The calculator 18 is capable of displaying a dark field image by receiving a signal from the dark field image observation unit 17.

An example of an embodiment at acceleration voltages of 200 kV, 120 kV, and 60 kV will be described with reference to FIG. 5. A 12-pole lens illustrated in FIG. 1 is assumed to be mounted in the aberration corrector 9 illustrated in FIG. 5.

First, in a case where an acceleration voltage is 200 kV, the control unit 16 generates a hexapole field by magnetizing a pole group 1 of the 12-pole lens. In this case, the control unit 16 does not magnetize a pole group 2 of the 12-pole lens. The magnetization of the 12-pole lens is assumed to satisfy (A) illustrated in FIG. 4 which is a hexapole field required to correct the spherical aberration (Cs) at an acceleration voltage of 200 kV. It is possible to determine whether the pole group 1 is magnetically saturated by detecting whether the spherical aberration Cs changes linearly when current magnetizing the pole group 1 is changed. If the magnetization current is proportional to the spherical aberration Cs, it is possible to determine that the pole group 1 is not magnetically saturated. If a change of the spherical aberration Cs with respect to the magnetization current is small, it is possible to determine that the pole group 1 is magnetically saturated. It is possible to obtain the magnitude of the spherical aberration Cs via aberration measurement.

The control unit 16 independently adjusts each element of the aberration corrector 9 illustrated in FIG. 5 such that the aberration correction condition calculated by the calculator 18 is satisfied. The control unit 16 independently adjusts elements such as the lenses other than the aberration corrector 9 illustrated in FIG. 5 such that a proper dark field image can be obtained.

Subsequently, in a case where an acceleration voltage is 120 kV, the control unit 16 generates a hexapole field by magnetizing the pole group 2 of the 12-pole lens. In this case, the control unit 16 does not magnetize the pole group 1 of the 12-pole lens. The magnetization of the 12-pole lens is assumed to satisfy (B) illustrated in FIG. 4 which is a hexapole field required to correct the spherical aberration (Cs) at an acceleration voltage of 120 kV. It is possible to determine whether the pole group 2 is magnetically saturated by detecting whether the magnetization current and the spherical aberration Cs change linearly similar to the case in which an acceleration voltage is 200 kV.

Each element of the aberration corrector 9 illustrated in FIG. 5 is adjusted based on Expression (1), and finally, is independently adjusted by the control unit 16 such that an aberration correction condition calculated by the calculator 18 is satisfied. After the elements such as the lenses other than the aberration corrector 9 illustrated in FIG. 5 are similarly adjusted based on Expression (1), finally, the control unit 16 independently adjusts the elements such that a proper dark field image can be obtained.

Finally, in a case where an acceleration voltage is 60 Kv, the control unit 16 generates hexapole fields by magnetizing both the pole group 1 and the pole group 2 of the 12-pole lens. The magnetization of the 12-pole lens is assumed to satisfy (C) illustrated in FIG. 4 which is a hexapole field required to correct the spherical aberration (Cs) at an acceleration voltage of 60 kV. It is possible to determine whether the pole group 1 and the pole group 2 are magnetically saturated by detecting whether the magnetization current and the spherical aberration Cs change linearly similar to the case in which an acceleration voltage is 200 kV.

As such, according to the present invention, it is possible to obtain an arbitrary strength, which satisfies multiple types of spherical aberration (Cs) correction conditions, in a magnetically saturated state by magnetizing only one pole group of two pole groups of the 12-pole lens, or magnetizing both the pole group 1 and the pole group 2 even if the magnetization current of the objective lens is considerably changed, for example, an acceleration voltage is changed.

As a result, it is possible to provide an aberration corrector that reduces an effect such as a decrease in resolving power caused by a deflecting component to be superimposed on the hexapole field of the 12-pole lens. If the pole group 1 and the pole group 2 have the same pole shapes, a method of magnetizing either the pole group 1 or the pole group 2, and a method of simultaneously magnetizing the pole group 1 and the pole group 2 may be adopted.

OTHER EXAMPLES

In the example, the technique of the present invention is applied to an aberration corrector mounted in a scanning transmission electron microscope. Alternatively, the present invention can be applied to a transmission electron microscope. The present invention can be applied to not only a device using electrons as charged particles, but also a device using other charged particles such as ions.

In the description of the example, the magnetization current of the objective lens is considerably changed by changing an acceleration voltage. Alternatively, the magnetization current of the objective lens is considerably changed by changing the shape of a pole piece (magnetic piece) of the objective lens. Accordingly, in a case where an operator sets a change in the shape of the pole piece via the control unit, the control unit 16 may select a pole group to be magnetized or a combination of pole groups to be magnetized such that magnetization current, which is demanded according to the set shape of the pole piece, is satisfied.

In the example, each pole group is assumed to be magnetized in a range in which the strength of a hexapole field is saturated. Each pole group may be magnetized in a state where the strength of a hexapole field to be generated is not completely saturated, but to a magnetization value at which the range of change of the strength is in an allowable range.

In the example, a 12-pole lens is exemplified, and alternatively, the present invention can be also applied to a multipole lens such as a 12 or more pole lens including poles, the number of which is a multiple of six. For example, in a case where a multipole lens is an 18-pole lens, and three sets of six pole groups are capable of generating different strengths of hexapole fields, it is possible to select a method of individually magnetizing the three sets of six pole groups, a method of magnetizing arbitrary two sets of six pole groups of the three sets of six pole groups, and a method of simultaneously magnetizing the three sets of six pole groups. As such, it is possible to further increase the number of applicable aberration correction conditions by increasing the number of poles.

As described above, the example is given to help easy understanding of the present invention, and all the configuration elements are not necessarily included. Other configuration elements may be added to the configuration of the example, a portion of the configuration elements of the example may be replaced with other configuration elements, or a portion of the configuration elements of the example may be deleted.

A portion of or all the configuration elements, functions, processing units, processing means, and the like may be realized by an integrated circuit or other hardware. The configuration elements and functions may be realized by interpreting and realizing a program for realizing each function via a processor. That is, each configuration element may be realized by software. In this case, it is possible to store information such as a program for realizing each function, tables, files, and the like in a storage device such as a memory, a hard disk, or a solid state drive (SSD) or a storage medium such as an IC card, an SD card, a DVD, or the like.

REFERENCE SIGNS LIST 1a to 1f: pole (having a shape different from that of poles 2a to 2f)
2a to 2f: pole (having a shape different from that of poles 1a to 1f)
3: coil
4: electron beam source
5: electron beam
6 and 7: irradiation lens
8: adjustment lens
9: aberration corrector
10: transfer lens
11: scan coil
12: objective lens
13: specimen
14: projection lens
15: dark field image detector
16: control unit
17: dark field image observation unit
18: calculator

The invention claimed is:

1. A charged particle beam device comprising:
a charged particle beam source;
a charged particle optical system that irradiates a specimen with charged particle beams which are formed of charged particles released from the charged particle source;
an objective lens that focuses the charged particle beams;
a spherical aberration corrector that satisfies a magnetically saturated state in multiple aberration correction conditions by selectively magnetizing multiple sets of pole groups of a multipole lens according to a change in magnetization current of the objective lens; and
a control unit that controls the charged particle optical system and the spherical aberration corrector.

2. The charged particle beam device according to claim 1, wherein the multiple aberration correction conditions respectively correspond to multiple acceleration voltages.

3. The charged particle beam device according to claim 1, wherein the multiple aberration correction conditions respectively correspond to multiple pole piece shapes of the objective lens.

4. The charged particle beam device according to claim 1, wherein the multipole lens is a 12-pole lens including 12 poles, and
wherein a first aberration correction condition is satisfied by magnetizing a first pole group including six poles of the 12 poles, a second aberration correction condition is satisfied by magnetizing a second pole group including other six poles, and a third aberration correction condition is satisfied by magnetizing all the 12 poles.

5. The charged particle beam device according to claim 1, wherein the multipole lens is a multipole lens including 12 or more poles, and
wherein a first aberration correction condition is satisfied by magnetizing a first pole group including six poles of the 12 or more poles, and one or multiple other aberration correction conditions are satisfied by selectively magnetizing a pole group including poles apart from the six poles, or another pole group including the six poles.

6. The charged particle beam device according to claim 1, wherein the multipole lens is a 12-pole lens including 12 poles, and
wherein a first aberration correction condition is satisfied by magnetizing a first pole group including six poles of the 12 poles, and a second aberration correction condition is satisfied by magnetizing a second pole group including other six poles.

7. A spherical aberration correction method of a charged particle beam device including a charged particle beam source; a charged particle optical system that irradiates a specimen with charged particle beams which are formed of charged particles released from the charged particle source; an objective lens that focuses the charged particle beams; a spherical aberration corrector that corrects a spherical aberration of the charged particle optical system; and a control unit that controls the charged particle optical system and the spherical aberration corrector,
wherein the control unit satisfies a magnetically saturated state in multiple aberration correction conditions by selectively magnetizing multiple sets of pole groups of a multipole lens according to a change in magnetization current of the objective lens.

8. The spherical aberration correction method according to claim 7,
wherein the control unit controls the spherical aberration corrector according to a change in acceleration voltage.

9. The spherical aberration correction method according to claim 7,
wherein the control unit controls the spherical aberration corrector according to a change in the pole piece shape of the objective lens.

10. The spherical aberration correction method according to claim 7,
wherein the multipole lens is a 12-pole lens including 12 poles, and
wherein the control unit magnetizes a first pole group including six poles of the 12 poles such that a first aberration correction condition is satisfied, the control unit magnetizes a second pole group including other six poles such that a second aberration correction condition is satisfied, and the control unit magnetizes all the 12 poles such that a third aberration correction condition is satisfied.

11. The spherical aberration correction method according to claim 7,
wherein the multipole lens is a multipole lens including 12 or more poles, and
wherein the control unit magnetizes a first pole group including six poles of the 12 or more poles such that a first aberration correction condition is satisfied, and the control unit selectively magnetizes a pole group including poles apart from the six poles, or another pole group including the six poles such that one or multiple other aberration correction conditions are satisfied.

12. The spherical aberration correction method according to claim 7,
wherein the multipole lens is a 12-pole lens including 12 poles, and
wherein the control unit magnetizes a first pole group including six poles of the 12 poles such that a first aberration correction condition is satisfied, and the control unit magnetizes a second pole group including other six poles such that a second aberration correction condition is satisfied.

* * * * *